METHOD OF MANUFACTURING IMPROVED MIS TRANSISTOR ARRAYS

Filed July 19, 1967 2 Sheets-Sheet 1

Francis Hugle
INVENTOR.

April 6, 1971 F. HUGLE 3,574,007

METHOD OF MANUFACTURING IMPROVED MIS TRANSISTOR ARRAYS

Filed July 19. 1967 2 Sheets-Sheet 2

Francis Hugle
INVENTOR.

3,574,007

METHOD OF MANUFACTURING IMPROVED MIS TRANSISTOR ARRAYS

Frances Hugle, Santa Clara County, Calif., assignor to Frances Hugle, as trustee of Francis Hugle trust Filed July 19, 1967, Ser. No. 654,605
Int. Cl. H01l 7/36, 11/00
U.S. Cl. 148—175 5 Claims

ABSTRACT OF THE DISCLOSURE

A process for producing a large plurality of MIS devices, which may also be associated with simultaneously produced circuit elements to form integrated circuits. A non-single crystal substrate receives a thin layer of semiconductor in an epitaxial reactor, a thinner layer of a first insulating material, a thicker layer of a second insulating material, selective etching of these insulating materials, the formation of junctions by diffusion through etched areas, and a metallic coating deposited and etched to provide connections. Plural reactor steps are successively taken to minimize contamination of the product.

Figure 1:
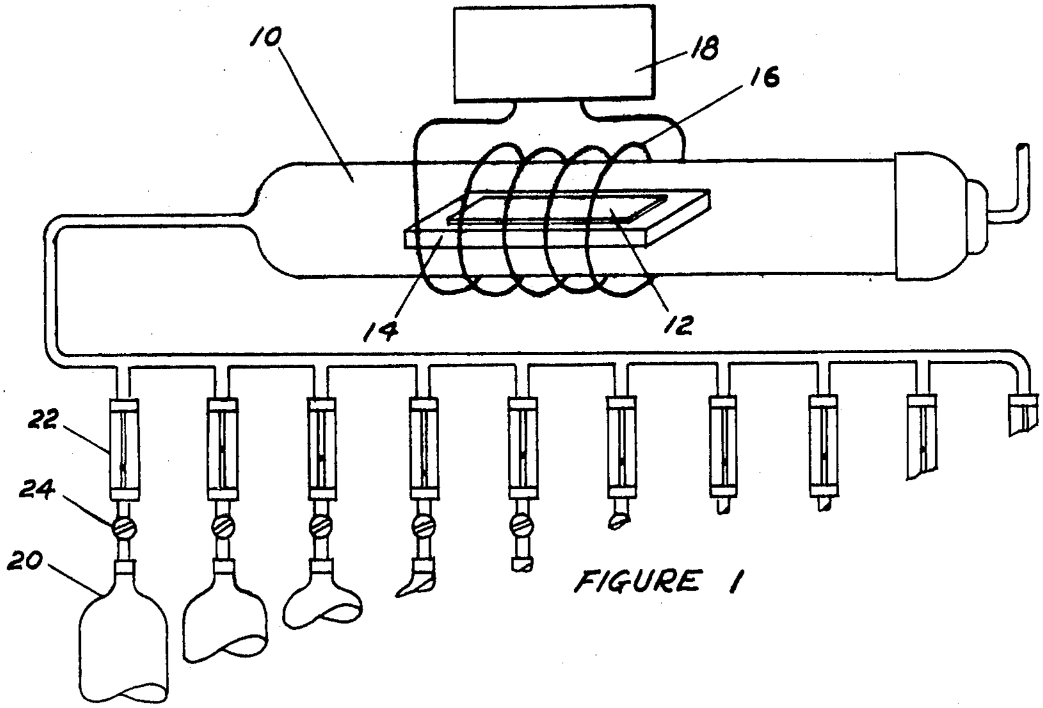

This invention relates to a method of producing large arrays of semiconductor devices on non-single crystal insulating substrates under conditions of extreme cleanliness and surface protection.

Integrated monolithic semiconductor circuits, consisting of one or more active devices such as diodes, transistors, controlled rectifiers, etc. usually combined with such passive elements as resistors or capacitors are currently made by diffusing the active elements and many of the passive elements into a piece of single crystal semiconductor material such as silicon, germanium, gallium arsenide, etc. The passive elements that are not diffused into the semiconductor crystal are deposited on top of it.

Single crystal semiconductors of very high crystal perfection are used because the electronic performance of standard bipolar transistors depends on the minority carrier lifetime, which depends on crystal perfection. These crystals are grown as rods of one or two inch diameter which are then sliced and lapped into discs. The discs are cleaned, oxidized, etched and diffused, usually several times, and then metallized to produce an array of devices or integrated circuits. These discs, or wafers, are exposed to room air many times during these manufacturing steps and even though the air is cleaned at great expense, contamination of the surface occurs and this results in localized surface defects which cause some percentage of the circuits to be rejected. The larger the circuit, the larger the reject percentage due to these defects. Very large circuits, containing tens of thousands of devices on a square inch or more of single crystal wafer have been almost impossible to make, and yet still larger circuits are greatly desired.

There is a class of transistors whose operation does not depend upon minority carrier lifetime. These are the field effect or unipolar transistors, which are majority carrier devices with electrical characteristics similar in many ways to vacuum tubes. In these devices the current between the "source" and the "drain" is modulated by the voltage on the "gate." The current path between the source and drain is called the "channel." When the gate is meallic and is separated from the channel by a dielectric layer, the devices are called MIS (Metal-insulator-semiconductor) transistors or MOS (Metal-oxide-semiconductor) or even MNS (Metal-nitride-semiconductor) transistors. These transistors, and associated resistors and capacitors, can be made in polycrystalline semiconductor material and, if the process prevents surface contamination, can be made in very large arrays with very high yield.

It is an object of this invention to make integrated circuits on inexpensive non-single crystal substrates.

It is a further object of this invention to make larger integrated circuits than is possible in single crystal semiconductor wafers.

It is a further object of this invention to substantially improve the yield of large scale integrated circuits.

It is a further object of this invention to improve the quality and performance of integrated circuits.

It is a further object of this invention to simplify the manufacture of integrated circuits.

It is a further object of this invention to reduce the cost of manufacturing integrated circuits.

It is a further object of this invention to improve the uniformity of the gate characteristics of MIS devices.

Other objects and the attendant advantages of this invention will be readily appreciated as the same becomes understood by reference to the following detailed description when considered in connection with the accompanying drawings.

FIG. 1 is a schematic representation of the principal piece of apparatus for this process. This is similar to the epitaxial reactors that are commonly used to grow single crystal semiconductor layers on single crystal substrates. The apparatus consists of a chamber 10 in which the substrates 12 are laid upon a susceptor 14 which is induction heated by a coil 16 connected to an AC generator 18. Sources 20 of the appropriate chemicals are connected to the chamber 10 via metered lines 22 with valves 24.

The semiconductor is chemically deposited in a thin layer on the substrate 12 by introducing the appropriate gases into the chamber 10 when the substrates 12 have been heated to the proper temperature. Without opening the chamber 10 or exposing the semiconductor film to contamination, the gas composition is changed to deposit one or more insulating layers.

Figure 2:
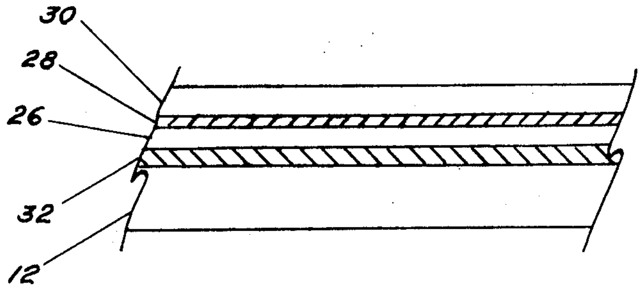

FIG. 2 shows a cross section through the substrate 12 with a layer of polycrystalline semiconductor 26 and two dielectric layers 28, 30. It is important that the thermal coefficient of expansion of the substrate 12 be similar to that of the semiconductor 26 to prevent thermal stress. If the substrate 12 does not match the semiconductor 26 in thermal expansion coefficient, it is desirable to first deposit a dielectric 32 of intermediate expansion coefficient to act as a "graded seal" between the semiconductor 26 and the substrate 12.

The substrates are now removed from the reaction chamber to selectively etch holes in the insulating layer(s) where the sources, drains and resistors are to be formed. The selective etchings and the associated masking operations can be done by photolithographic techniques, usually using photoresists, which are very well known in the art. The gate areas are also etched to make the insulating layer thinner over the gates. The thinner gate dielectric has greater capacitance and this results in higher gain for the transistor as well as lower offset voltage. There is an advantage in multiple dielectric layers which permit the top layer to be etched away over the gate while leaving the lower layer(s) intact by virtue of its relative inertness to the etchant. This technique gives excellent control of gate thickness because the thickness of the deposited layers is easily controlled.

Figure 3:
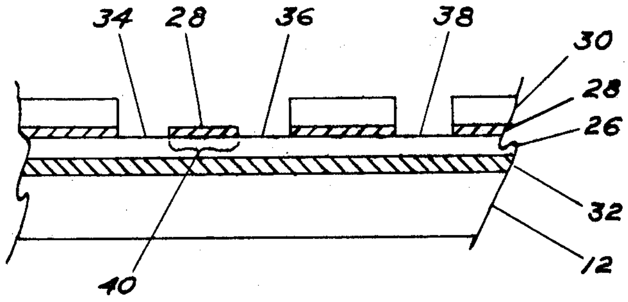

FIG. 3 shows the section through the substrate of FIG. 2 after the selective etching operations.

The semiconductor layer 26 has been exposed in the source 34, drain 36 and resistor 38 areas. The second dielectric layer 30 has been removed over the channel 40, which is the area of semiconductor 26 between source 34 and drain 36. The first dielectric layer 28 is intact over the channel 40. Resistors 38 are not always as shown in MIS integrated circuits. Frequently the resistor function is performed by other MIS transistors suitably biased.

The substrate is now returned to the reaction chamber and heated in a suitable gas mixture. Since the source 34 and drain 36 areas have been exposed to contaminating enviroments, it is desirable to introduce gases and/or create thermal conditions that will etch or remove a thin layer and expose a fresh, clean surface of the semiconductor 26. A doping gas is now introduced from one of the reactant sources 20. The dopant is of the opposite type from the dopant in the semiconductor layer 26. If the semiconductor layer 26 is N type, the dopant now introduced must be the P type and conversely, if the semiconductor layer 26 is P type, the dopant now introduced must be N type. The substrates 12 are maintained at a sufficient temperature while being exposed to the dopant gas for a sufficient time for the dopant to diffuse into the semiconductor 26 and form a PN junction.

Figure 4:
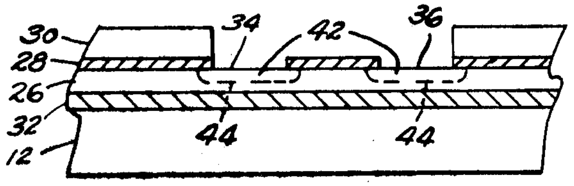
Figure 5:
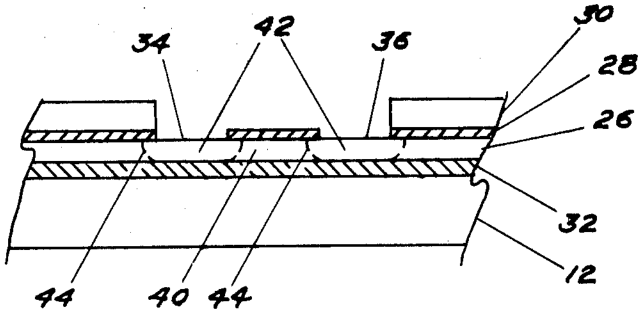
Figure 6:
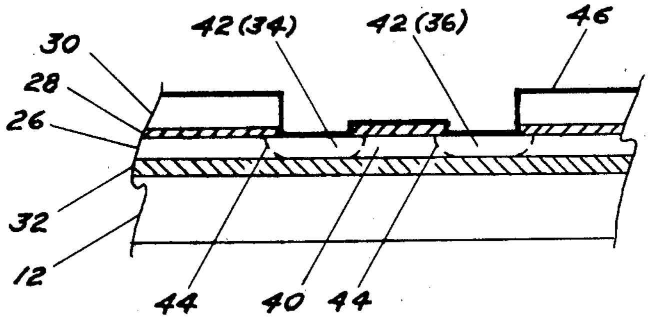
Figure 7:
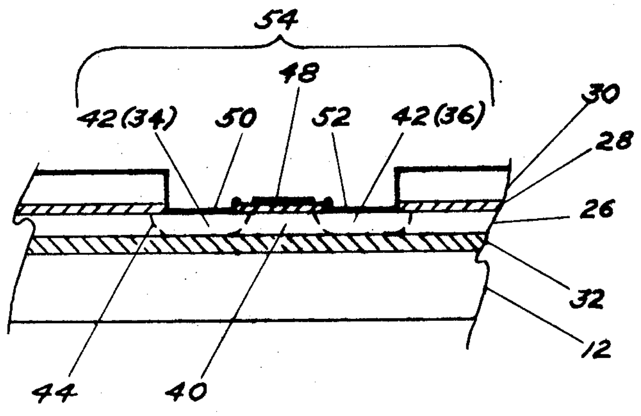

FIG. 4 shows an N(P) region 42 diffused into the P(N) semiconductor 26 forming PN junctions 44. FIG. 5 shows the same, but with N(P) region 42 diffused entirely through the P(N) semiconductor 26. This results in less junction 44 area and, therfore, less parasitic capacitance and less leakage. This is a desireable condition. Since the semiconductor layer 26 can be very thin, the condition of FIG. 5 is achieved in a time which is usually much shorter than the diffusions of conventional bipolar transistors. When the diffusion stage is finished and without removing the substrate 12 from the chamber 10, the temperature and gas composition are adjusted to deposit a metal layer 46 as in FIG. 6. The substrates 12 are removed a second time from the chamber 10 and the metal 46 is selectively etched using normal photolithographic techniques into the desired pattern of contacts and interconnects. FIG. 7 is a section showing the metal gate 48, the source contact 50 and the drain contact 52 of the finished MIS transistor 54. A relatively small reactor can accommodate a 3" x 9" substrate on which several million transistors can be made and interconnected.

The following examples are typical applications of this invention:

EXAMPLE 1

Place a clean flat, high alumina substrate on a susceptor and into the reaction chamber. Flow pure $H_2$ (hydrogen) through the chamber for a few minutes and then inductively heat the susceptor until the substrate reaches 1200° C. Maintain the substrates at 1200° C., with pure hydrogen flowing, for 10 minutes and then introduce HCl (hydrogen chloride) into the gas stream for an additional 5 minutes. The substrates have now been thoroughly cleaned. Stop the HCl and reduce the temperature to 650° C. Introduce $GeCl_4$ (germanium tetrachloride) and $AsH_3$ (arsine) into the hydrogen stream until ½ micron of N type germanium has been deposited on the substrate. Stop the $GeCl_4$ and the $AsH_3$ and intorduce $SiCl_4$ (silicon tetrachloride) and $NH_3$ (ammonia) into the hydrogen stream, raising the temperature to 800° C., to deposit 2000 A. of silicon nitride. Stop the $NH_3$ and introduce $CO_2$ (carbon dioxide) to deposit 1.5 microns of $SiO_2$ (silicon dioxide). Turn off the $SiCl_4$ and $CO_2$, leaving only $H_2$ flowing and turn off the power and allow the substrate to cool. Remove the cooled substrate and, using photoresist and a mask, remove by etching the $SiO_2$ and silicon nitride from the source and drain areas. Using photoresist and another mask, remove the $SiO_2$, only, from the gate area, leaving the silicon nitride intact. Replace the substrate on the susceptor and into the chamber and start the $H_2$ flowing. Raise the temperature of the substrate to 700° C. and introduce HCl to etch away about 500 A. of the germanium in the exposed source and drain areas. Stop the HCl and introduce diborane into the gas stream. The boron will diffuse into the source and drain areas, converting them to P type. Allow 30 minutes for the boron diffusion. Discontinue the diborane and introduce $MoCl_5$ (molybdenum pentachloride) which will deposit metallic molybdenum all over the surface of the substrate. After one micron has deposited, stop the molybdenum pentachloride and permit the substrates to cool in either pure $H_2$ or $N_2$ (nitrogen). When cool, remove it from the reaction chamber and using photoresist and a mask, etch the moldbdenum into the desired metal pattern.

EXAMPLE 2

Place a clean flat 99.95% alumina substrate on a susceptor and into the reaction chamber. Flow pure $H_2$ through the chamber and inductively heat the susceptor until the substrate reaches 1400° C. Maintain the substrates at 1400° C. for 10 minutes in pure $H_2$ and for an additional 5 minutes with HCl added to the hydrogen, to thoroughly clean the substrates. Stop the HCl and reduce the substrate temperature to 1175° C. Introduce $SiCl_4$ and $PH_3$ (phosphine) into the hydrogen stream until 3000 A. of N type silicon has been deposited on the substrate. Stop the $PH_3$ and add $CO_2$ to the gas stream to deposit only 200 A. of $SiO_2$ then stop the $CO_2$ and introduce $NH_3$, reducing the temperature to 900°, until 1000 A. of $Si_3N_4$ (silicon nitride) have been deposited. Stop the $NH_3$ and reintroduce $CO_2$ and deposit another micron of $SiO_2$. Turn off all gases but the $H_2$, turn off the power, and allow the substrates to cool. When cool, remove from the reaction chamber and, using photoresist and a mask, remove by etching the $SiO_2$ and $Si_3N_4$ from the source and drain areas. Using photoresist and another mask, remove the top layer of $SiO_2$ from the gate region, leaving the 1000 A. of $Si_3N_4$ over the 200 A. $SiO_2$ layer. Replace the substrate on the susceptor and into the chamber and start the $H_2$ flowing again. Raise the temperature of the substrates to 1200° C. and introduce HCl into the $H_2$ stream until a few hundred angstroms of Si (silicon) have been etched away. Turn off the HCl and introduce $B_2H_6$ (diborane). Maintain the $B_2H_6$ atmosphere until the diffused P region has gone through the entire silicon thickness—about 30 minutes. Stop the $B_2H_6$ and reduce the temperature to 900° C. Introduce $TaCl_5$ (tantalum pentachloride) and deposit one micron of tantalum over the entire surface. Stop the $TaCl_5$ and the $H_2$, turn off the power, and allow the substrates to cool in a $N_2$ atmosphere. When cooled, remove the substrates from the chamber and, using photoresist and a mask, etch the tantalum into the desired pattern.

Many variations are possible. The semiconductors are not limited to silicon and germanium, nor need they be deposited from the tetrachlorides. The hydrides or chlorohydrides are among the other suitable sources. Many sources of dopants other than those mentioned can be used, as well as different cleaning techniques, different insulating materials, different metal layers, and different times and temperatures. The electronic characteristics desired will largely determine what materials will be used, how thick the layers will be, how long the individual parts of the operation will take, and what the temperatures and gas concentrations will be. Titanium dioxide is a particularly interesting dielectric for the gate because of its high dielectric constant, which permits high gain and low offset voltage. One way of deposting $TiO_2$ (titanium dioxide) is to substitute $TiCl_4$ (titanium tetrachloride) for $SiCl_4$; in an atmosphere of $CO_2$ and $H_2$.

The process is not limited to monatomic semiconductors, but applies equally to compound semiconductors such as gallium arsenide. The conditions for depositing compound semiconductors on non-single crystal insulating substrates are essentially the same as the conditions for depositing the same semiconductors epitaxially.

Having thus described the invention I claim:

1. A reactor process for making a large plurality of

MIS devices at one time, each having source, drain and gate areas, which includes the steps of:

(a) heating a non-single crystal insulating substrate in said reactor to a temperature similar to that for epitaxial deposition of a desired semiconductor;

(b) depositing a thin layer of N type semiconductor upon said substrate by introducing an atmosphere containing at least one compound of the desired semiconductor and an N type dopant;

(c) depositing a thinner layer of insulating material of a first chemical compound upon said N type semiconductor;

(d) depositing a layer several times thicker than said thinner layer of insulating material of a second chemical compound upon said thinner layer of insulating material;

(e) removing the resulting product from said reactor;

(f) masking and etching to remove both said layers of insulating material from each of said source and drain areas;

(g) further masking and etching to remove all of the insulating layer of said second chemical compound and a part of the layer of said first chemical compound over the entire of each of said gate areas;

(h) again heating the now etched resulting product in said reactor in an atmosphere that additionally etches each of said source and drain areas to a clean semiconductor surface;

(i) continuing the second heating in an atmosphere containing an impurity of the P type to diffuse PN junctions at each of said source and drain areas; and (j) continuing further said second heating in an atmosphere containing a metallic compound to deposit a layer of metal over the entire surface of the then resulting product.

2. The process of claim 1 in which the N and P types of impurities of semiconductor are interchanged.

3. The process of claim 1 in which the insulating material of said first chemical compound is silicon nitride and the second is silicon dioxide.

4. The process of claim 1, which includes the additional step of;

(a) selectively etching the cooled then resulting product to form separate metallic connections for said areas of each said MIS device.

5. The process of claim 1, in which;

(a) additional areas are etched at the same time and in the same manner as employed for etching said source and drain areas;

(b) said additional areas are again heated for cleaning, diffused with an impurity, and coated with said metallic deposit at the same time that these steps are performed according to claim 1; and (c) said additional areas are selectively etched to form a resistive element of each said additional area and metallic connection thereto.

References Cited

UNITED STATES PATENTS

| | | | |
|---|---|---|---|
| 3,223,904 | 12/1965 | Warner, et al. | 317—235 |
| 3,334,281 | 8/1967 | Ditrick | 317—235 |
| 3,342,650 | 9/1967 | Seki et al. | 148—187 |
| 3,350,222 | 10/1967 | Ames et al. | 117—212 |
| 3,354,360 | 11/1967 | Campagna et al. | 317—234 |
| 3,375,419 | 3/1968 | Wagener et al. | 317—235 |
| 3,385,729 | 5/1968 | Larchian | 117—200 |
| 3,416,224 | 12/1968 | Armstrong et al. | 148—187X |
| 3,419,761 | 12/1968 | Pennebaker | 317—234 |
| 3,424,955 | 1/1969 | Seiter et al. | 317—234 |
| 3,377,513 | 4/1968 | Ashby et al. | 317—101 |
| 3,437,533 | 4/1969 | Dingwall | 148—187 |

OTHER REFERENCES

Fa, C. H. et al.: "The Poly-Silicon Insulated-Gate Field Effect Transistor," IEEE Trans. on electronic devices, vol. ED–13, No. 12, pp. 290–291 (1966).

Mueller, C. W. et al.: "Grown-Film Silicon Transistors on Sapphire," IEEE, Proceedings, vol. 52, pp. 1487–90 (1964).

L. DEWAYNE RUTLEDGE, Primary Examiner

WILLIAM G. SABA, Assistant Examiner

U.S. Cl. X.R.

29—571; 117—212; 148—33, 174; 156—17; 317—235